(12) United States Patent
Roy

(10) Patent No.: US 6,664,850 B1
(45) Date of Patent: Dec. 16, 2003

(54) DELAY VARIABILITY REDUCTION METHOD AND APPARATUS

(75) Inventor: Aninda Roy, San Jose, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 50 days.

(21) Appl. No.: 10/027,799

(22) Filed: Dec. 19, 2001

(51) Int. Cl.[7] .................................................. H03F 1/02
(52) U.S. Cl. ........................... 330/9; 330/69; 330/280; 341/118; 341/120; 341/143; 341/144; 341/155
(58) Field of Search ............................. 330/9, 68, 280; 341/118, 120, 143, 144, 155; 327/55, 48; 326/89

(56) References Cited

U.S. PATENT DOCUMENTS

| | | | | |
|---|---|---|---|---|
| 5,051,629 A | * | 9/1991 | Hopkins ..................... 327/276 |
| 5,283,578 A | * | 2/1994 | Ribner et al. ................ 341/143 |
| 5,917,440 A | * | 6/1999 | Khoury ........................ 341/143 |
| 5,982,315 A | * | 11/1999 | Bazarjani et al. ............ 341/143 |
| 6,097,248 A | * | 8/2000 | Segami .......................... 330/9 |
| 6,262,616 B1 | * | 7/2001 | Srinivasan et al. ......... 327/264 |
| 6,396,322 B1 | * | 5/2002 | Kim et al. ................... 327/158 |

\* cited by examiner

*Primary Examiner*—Michael Tokar
*Assistant Examiner*—Linh Van Nguyen
(74) *Attorney, Agent, or Firm*—Townsend and Townsend and Crew LLP

(57) ABSTRACT

A method for reducing delay variability in a differential receiver includes receiving a plurality of differential input signals, determining a first transition delay time of an output in response to the plurality of differential input signals, determining a second transition delay time of the output in response to the plurality of differential input signals, and modifying capacitance coupled to the output in response to the first transition delay time and to the second transition delay time.

20 Claims, 6 Drawing Sheets

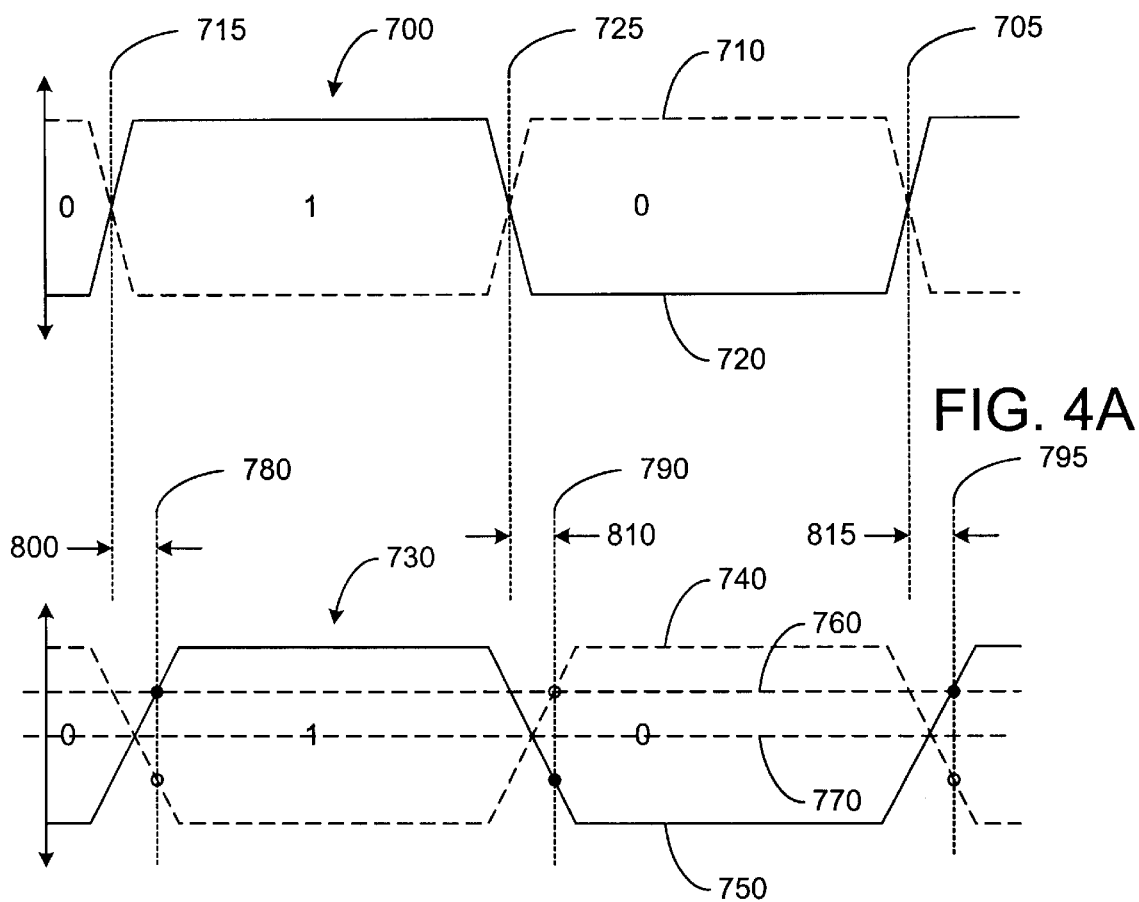
FIG. 4A
FIG. 4B
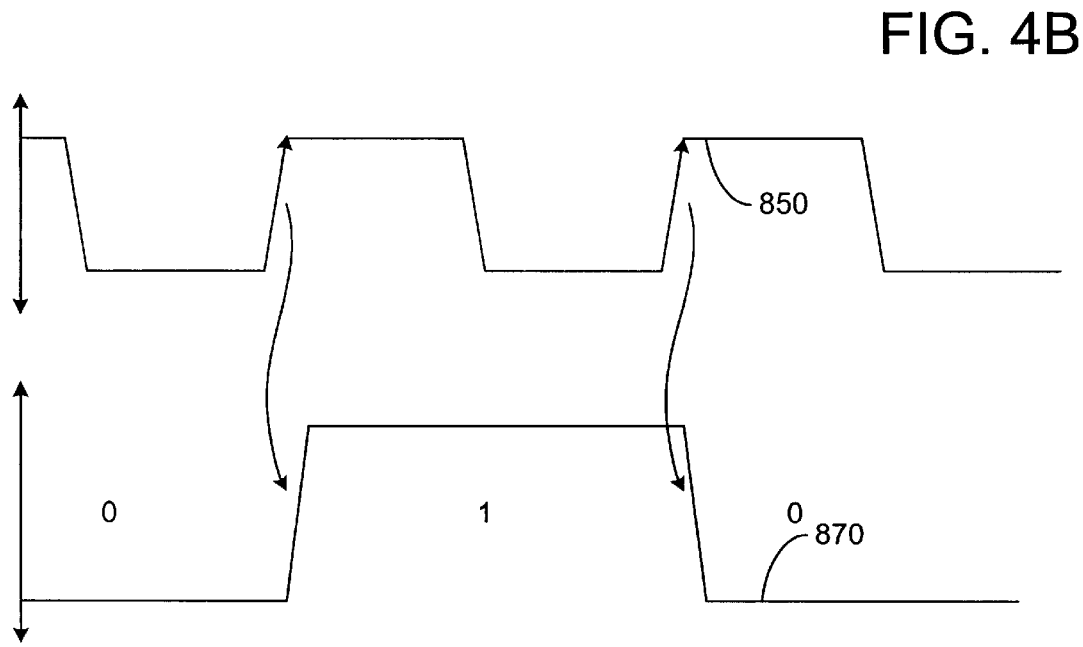
FIG. 4C

DELAY VARIABILITY REDUCTION METHOD AND APPARATUS

CROSS REFERENCE TO RELATED APPLICATIONS

The present invention is related to application Ser. No. 10/027,812, filed Dec. 19, 2001, titled Marginable Clock-Derived Reference Voltage Method and Apparatus. This application is incorporated by reference for all purposes.

BACKGROUND OF THE INVENTION

The present invention relates to improved performance amplifiers. More particularly, the present invention relates to methods for improving performance of differential amplifiers.

Most current receiving circuits are typically differential amplifiers or sense amplifier types. These circuits accept differential input signals and output differential output signals. Typically, such circuits take differential input voltage signals and covert the voltage to differential currents. These currents are typically integrated with capacitors coupled to the outputs of the differential amplifier. Accordingly, the delay of the circuit is a function of the differential current (the strength of the drivers) and the amount of capacitance in the capacitors.

When a differential receiver has an offset, for example, biased towards rising transitions or falling transitions, the differential currents will be larger for one transition or the other. Accordingly, the amount of delay from when the differential input signals transition to when the differential output signals transition will be different for the rising transition and for the falling transition. In other words, the variation in a rising transition delay and a falling transition delay will be different.

It has been discovered by the inventor that semiconductor process and manufacturing variations have a significant effect on differential amplifier performance. As an example, differential amplifiers may have a bias towards one state over another state, for example, a high bias or a low bias; and differential driver outputs of such amplifiers may have higher or lower output current relative to other amplifiers on the device. These variations cause differential amplifiers to have highly unpredictable behaviors from chip to chip or system to system. Such variations in behavior degrade the performance of the chips, systems, or the like.

In light of above, the inventor has determined that it is desirable to develop methods and apparatus that address the above problems.

BRIEF SUMMARY OF THE INVENTION

The present invention relates to methods and apparatus for enhanced performance differential amplifiers. More particularly, the present invention relates to methods for configuring differential amplifiers to reduce inherent offsets.

Embodiments of the present invention, reduce delay variability of a differential amplifier by adjusting capacitance values at the output nodes. In one example, when the inherent offset biases the rising transition, then output capacitance is reduced. Thus, although the falling transition has a smaller differential current, the reduced output capacitance for the transition results in the same or similar amount of delay as the rising transition.

One embodiment includes outputs of a differential amplifier being coupled to an array of capacitors via controllable switches. Upon startup or calibration, the capacitors are iteratively switched in and out and the rising transition delay and falling transition delay of the differential amplifier are determined. The capacitor (s) that are used in the normal operation of the differential amplifier is the one that minimizes the variation in the rising transition delay and falling transition delay (delay variability).

According to one aspect of the invention, a method for reducing delay variability in a differential receiver is disclosed. One such technique includes receiving a plurality of differential input signals, and determining a first transition delay time of an output in response to the plurality of differential input signals. A technique may also include determining a second transition delay time of the output in response to the plurality of differential input signals, and modifying capacitance coupled to the output in response to the first transition delay time and to the second transition delay time.

According to another aspect of the invention, another method for configuring a differential amplifier is disclosed. A process may include varying an amount of capacitance coupled to the differential amplifier, and for each amount of capacitance coupled to the differential amplifier, determining an associated delay variability factor of the differential amplifier. Various processes may also include the steps of determining a target amount of capacitance, the target amount of capacitance having an associated delay variability factor lower than other associated delay variability factors, and coupling the target amount of capacitance to the differential amplifier.

According to yet another aspect of the invention, an apparatus for amplifying differential signals is disclosed. One system includes a differential amplifier having differential outputs, a series of controllable switches coupled to the differential outputs of the differential amplifier, and a series of capacitors coupled to the series of controllable switches. One additional embodiment may include a state machine coupled to the differential outputs and to the series of controllable switches, the state machine configured to vary an amount of capacitance coupled to the differential outputs by controlling the controllable switches, wherein the state machine is also configured to determine an associated delay variability factor of the differential amplifier for each capacitance coupled to the differential outputs, and wherein the state machine is configured to determine a target amount of capacitance, the target amount of capacitance having an associated delay variability factor lower than other associated delay variability factors.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4A–E illustrate a process according to an embodiment of the present invention.

DETAILED DESCRIPTION OF THE INVENTION

Figure 1:
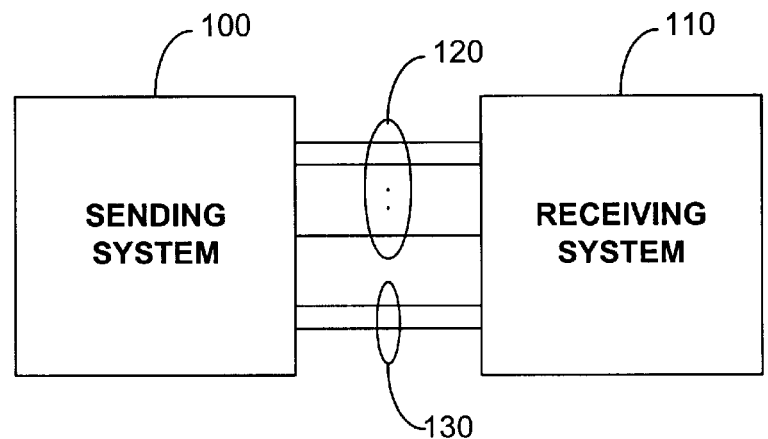
FIG. 1 illustrates a system level block diagram according to an embodiment of the present invention.

FIG. 1 illustrates a system level block diagram according to an embodiment of the present invention. FIG. 1 illustrates a first system 100 and a second system 110 coupled by a series of signal data lines 120, and clock lines 130.

In the present embodiment, first system 100 and second system 110 may be embodied as separate IC chips on a circuit board. For example, first system 100 may be an ASIC, a communications chip, a memory chip, a processor, or any other type of chip that provides output data signals. Further, second system 110 may also be any ASIC, communications chip, memory chip, processor, or any other type of chip that receives data signals. In other embodiments, first system 100 and second system 110 may be different cells on an integrated circuit, may be different processing or memory systems (computers), or the like. Accordingly, first system 100 and second system 110 may be millimeters apart, inches apart, and even feet apart.

In this embodiment, signal data lines 120 provide "single-ended" data signals between first system 100 and second system 110. As opposed to differential-data signals which provide a data signal over a pair of wires, each single-ended data signals is provided on a single wire. In this embodiment, it is contemplated that more than one signal data line is provided from first system 100 and second system 110.

Differential clock signals are passed on clock lines 130 between first system 100 and second system 110 in the present embodiment. By providing a timing clock, first system 100 and second system 110 are able to synchronize the timing of data signals provided between the systems. This allows for a higher data communication rate between first system 100 and second system 110. In this embodiment, clock lines 130 are typically provided over a pair of wires and include clock and clock'.

In this embodiment, it is contemplated that the typical rate for the clock are from 500 MHz and greater. Some embodiments include clock rates of 800 MHz and greater, and some embodiments include clock rates of 1 GHz and greater. It is believed by the inventor that the importance of this invention will increase with embodiments using even greater clock rates in the future.

Figure 2:
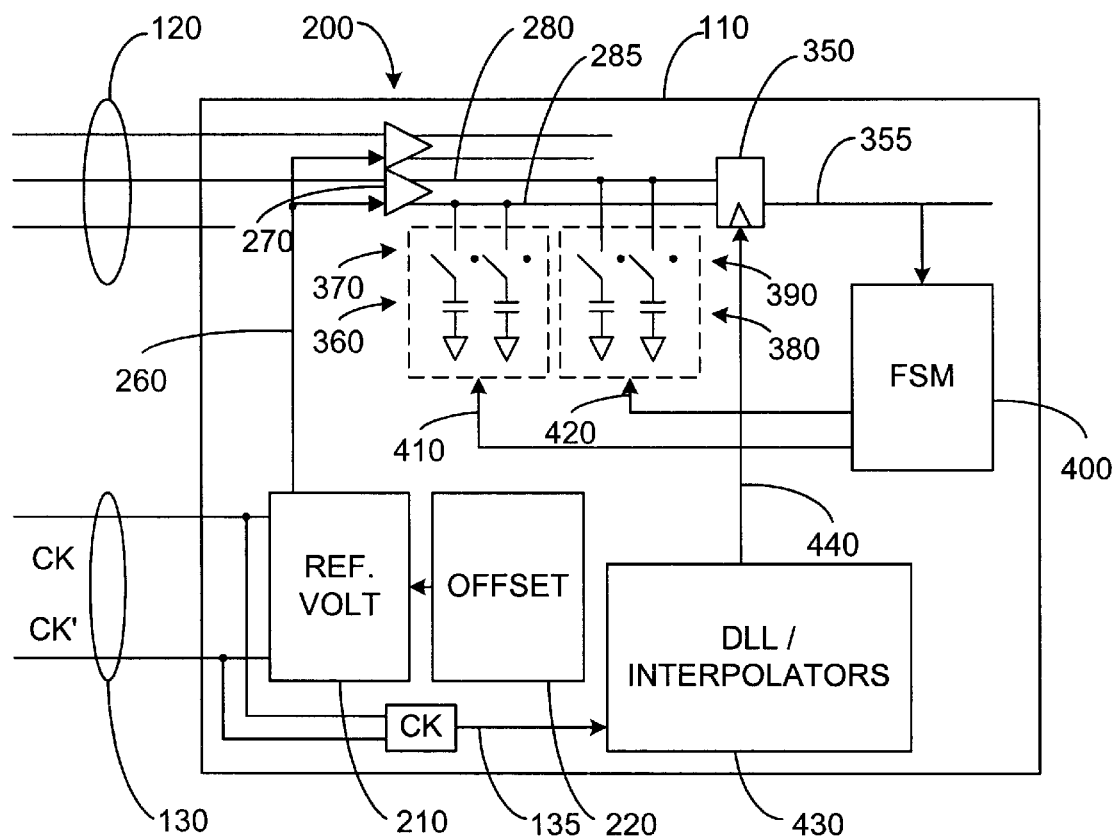
FIG. 2 illustrates a block diagram according to an embodiment of the present invention.

FIG. 2 illustrates a block diagram according to an embodiment of the present invention. In particular, FIG. 2 illustrates a more detailed diagram of second system 110, in FIG. 1.

In the present embodiment, second system 110 includes a receiver blocks 200, a voltage generating block 210, and an offset determination block 220. Depending upon the specific configuration, voltage generating block 210 may include a variety of sub blocks. In the embodiment in FIG. 2, voltage generating block 210 and offset determination block 220 may be embodied as described in the above cited reference. Many other ways for performing the above functions are also contemplated by the inventor.

Receiver block 200 is embodied in the present embodiment as one or more receiver circuits 270. In this embodiment, each receiver circuit 270 receives a data signal on signal line 120 and receives a reference voltage on signal line 260. These serve as differential inputs to receiver circuit 270. In response, each receiver circuit 270 outputs differential output signals on signal line 280 and signal line 285.

In the present embodiment, when an input test signal, such as an alternating series of 1s and 0s is applied as differential inputs to receiver circuit 270, the output signals on signal line 280 and signal line 285 may be characterized by a "data eye" as is known in the industry.

As illustrated in FIG. 2, signal line 285 is coupled to a bank of capacitors 360 via switches 370, and signal line 280 is coupled to a bank of capacitors 380 via switches 390. As will be discussed below, control lines 410 and 420 are used to control switches 370 and 390 so as to couple selected capacitors from bank of capacitors 360 to signal line 285 and to couple selected capacitors from bank of capacitor 380 to signal line 280, respectively. Accordingly, the amount of capacitance coupled to signal line 285 and 280 can be adjusted. In this embodiment, signal line 280 and signal line 285 are coupled to a latch 350 as shown.

In the present embodiment, latch 350 is provided to "sample" signals on signal line 280 and 285. As illustrated, latch 350 is coupled to a clock line 440 and latches signals typically upon the rising edge of a clock on clock line 440. As will be discussed below, the rising edge of a clock (phase) on clock line 440 is modified so that latch 350 "samples" signals on signal line 280 and 285 at different times. An output 355 of latch 350 is provided to a finite state machine (FSM) 400.

In FIG. 2, finite state machine (FSM) 400 is coupled via control lines 410 and 420 to switches 370, and 390, respectively. As mentioned above, control lines 410 and 420 specify digital codes to switches 370 and 390. The digital codes are used to close and open switches 360 and 370 to respectively add and subtract capacitance to and from signal lines 285 and 280. In the present embodiment, the digital codes output by FSM 400 are determined in response to the sampled signals from output 355 of latch 350. In this embodiment, FSM 400 is clocked. A more detailed description of the operation of FSM 400 will be given below.

FIG. 2 also illustrates a delay lock loop (DLL) circuit 430. In this embodiment, DLL circuit 400 receives a clock signal on clock line 135. The clock signal is typically generated based upon inputs from clock lines 130. Outputs of DLL circuit 430 are clock signal that are provided on clock line 440 to latch 350.

In the present embodiment, DLL circuit 430 generates a series of clock signals on clock line 440, each having a different clock phase. For example, in one embodiment, clocks having 20 different clock phases are output on clock line 440, one at a time. In other embodiments, a greater or lesser number of clock phases are generated. By providing clocks of different phases, the clock on clock line 440 have different rising edge locations. Since the clocks are input to latch 350, latch 350 latches ("samples") signals on signal line 280 and 285 at different rising edge locations.

In the present embodiment, DLL circuit 430 provides a series of clocks to latch 350, one after the other, each clock having a different phase. When clocks of all the different phases have been provided to latch 350, this is referred to herein as "sweeping" the clock over a data eye. In the present embodiment, the clock is swept over the data eye each time the capacitance coupled to signal line 280 and/or 285 is changed. As will be described below, by doing this, the characteristics of the data eye for receiver circuit 270 with a particular capacitance can be characterized.

Figure 3A:
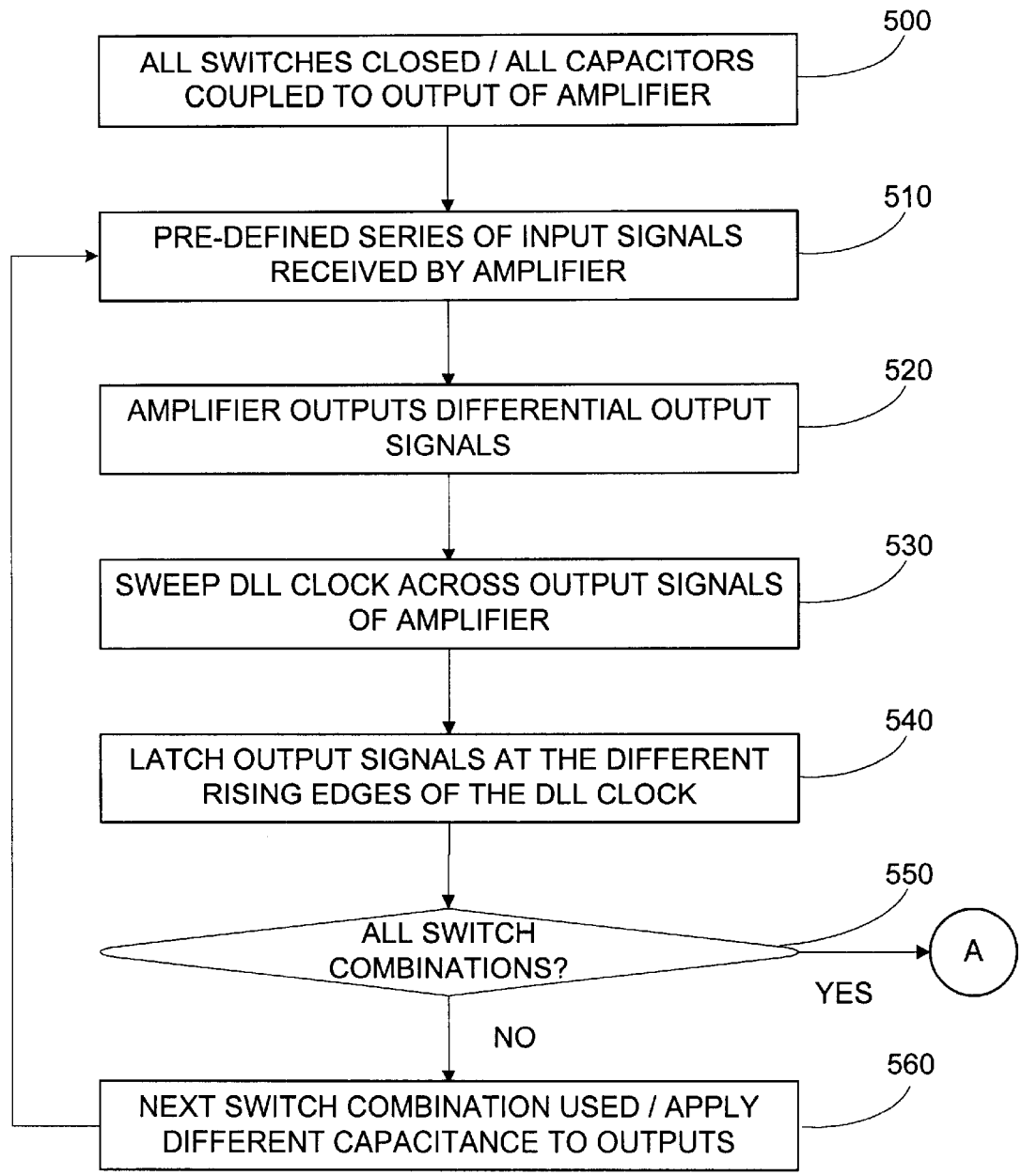
FIG. 3 illustrates a flow diagram according to an embodiment of the present invention.
Figure 3B:
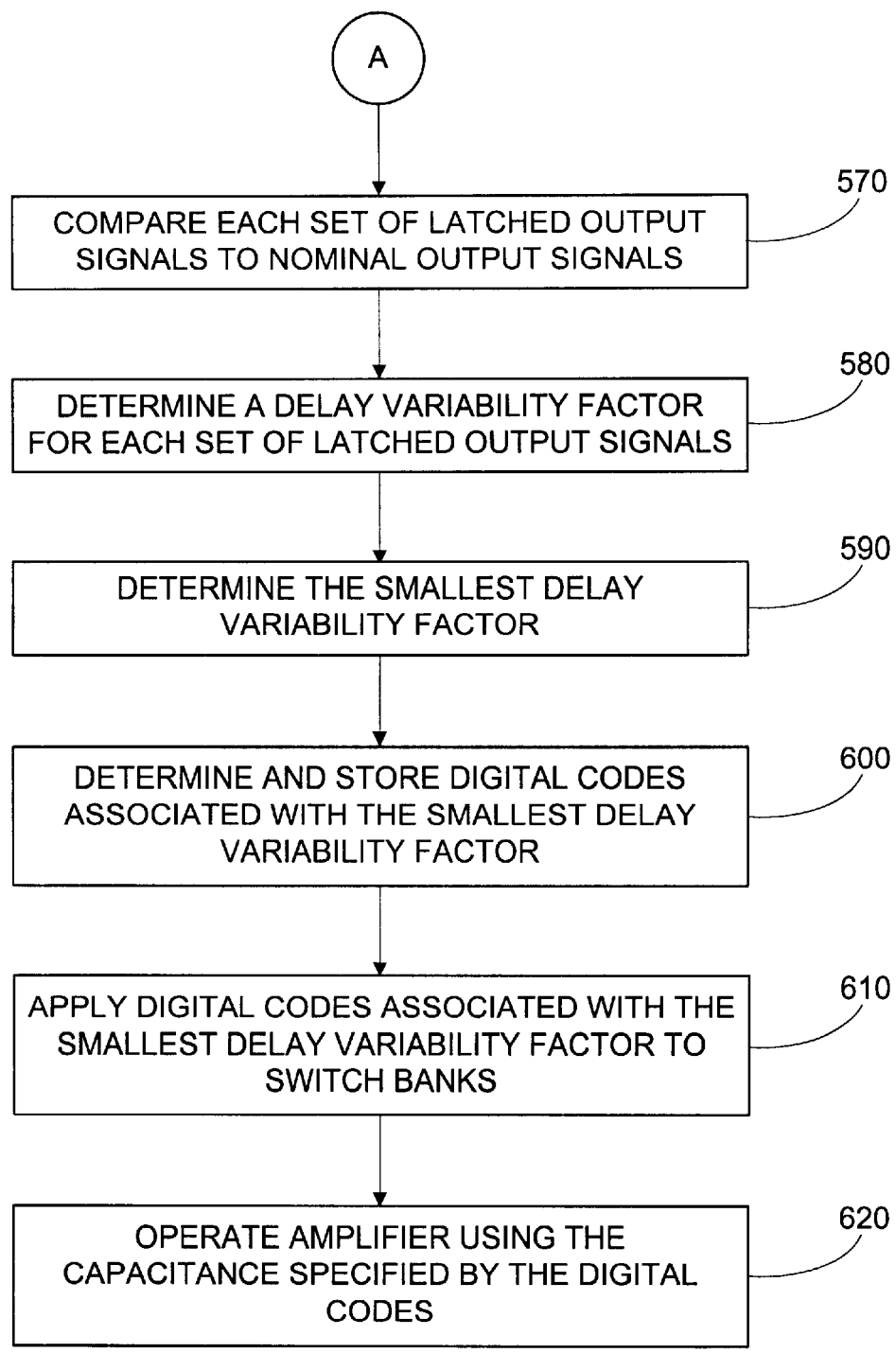

FIGS. 3A–B illustrate a flow diagram according to an embodiment of the present invention. More particularly, FIGS. 3A–B illustrate a process of determining a target capacitance to be coupled to receiver circuit 270 during "normal operation." This process may also be considered to configure or pre-configure receiver circuit 270. In an alternative embodiment switches 370 and 390 are initially turned off. In still another embodiment, only some of switches 370 and 390 are initially turned on.

In the present embodiment, initially all switches of switches 370 and 390 are turned on, step 500. Accordingly, all capacitors from bank of capacitors 360 and 380 are coupled to signal lines 285 and 280, respectively. Because the capacitors in bank of capacitors 360 and 380 are in coupled in parallel, the capacitance seen by the differential outputs of receiver circuit 270 is high.

Next, with the capacitance being held constant, a pre-defined series of input signals is received on signal data lines 120, step 510. In one embodiment, the pre-defined series of input signals is an alternating pattern of 1s and 0s: "0101010101 . . . " In this example, upon initialization of second system 110, first system 100 automatically sends the pre-defined series of signals for a predetermined amount of time.

In response to the input signals, receiver circuit 270 determines differential output signals on signal lines 280 and 285, step 520. In the present embodiment, the differential output signals on signal lines 280 and 285 when combined on the same graph or table, form a "data eye" as is known in the industry.

As will be illustrated below, the data eye may have a differential output that favors one transition over the other. For example, a receiver circuit 270 may "favor" an low-to-high transition by reflecting this transition in the output quicker than a high-to-low transition. A data eye representing this bias would be skewed and more closed.

In the present embodiment, still holding the capacitance constant, DLL circuit 430 "sweeps" the clock across the different clock phases, step 530. As mentioned above, by providing clocks of different phases to latch 350, latch 350 will "sample" the value specified by the differential output signal on signal lines 280 and 285, step 540. In this embodiment, the samples are thus effectively taken across the data eye. These samples are used to characterize the transitions of the data eye as will be described below.

In this embodiment, FSM 400 determines if all combinations of switches for switches 370 and 390 have been applied, step 550. If not, FSM 400 determines an appropriate digital code to apply to control lines 410 and/or 420 to cause additional switches from switches 370 and/or 390 to open or close, step 560. In the present embodiment, FSM 400 includes a predetermined sequence of digital codes that may represent all possible combinations of switch positions for switches 370 and 390. In one example, the digital codes may first keep switches 370 closed, while combinations of switches in switches 390 are opened and closed, and the like.

Next, the process described above is repeated. Specifically, receiver circuit 270 outputs differential outputs in response to the test differential input signal, and the differential output of receiver circuit 270 is again "sampled" across the data eye using the new capacitance values.

In the present embodiment, after samples have been taken of the differential output for every combination of coupled capacitance, the samples for each is compared to a nominal or ideal "sample," step 570. In this example, the nominal sample typically represents samples of an ideal data eye, i.e. a data eye that does not include a transition bias. As will be illustrated below, the amount of time for a low-to-high transition should be the same for a high-to-low transition in an ideal data eye.

Based upon the comparison, a "delay variability factor" is determined and associated for each of the capacitances applied based upon the comparison, step 580. In the present embodiment, the delay variability factor generally refers to differences in how receiver circuit 270 reacts to low-to-high transitions as compared to high-to-low transitions. In an ideal or nominal case, the low-to-high transition delay time and high-to-low transition delay time will take the same amount of time, thus there is no variation.

In the present embodiment, based upon all the delay variability factors for all of the difference capacitances, the capacitances that generate or are associated with the smallest delay variability factor is identified, step 590. Additionally, that capacitance should also have the closest match to a nominal or ideal data eye. As an example, what will be determined is the specific capacitances coupled on signal lines 280 and 285, respectively, that are characterized by the small delay variability factor and closeness to an ideal data eye. The digital codes that provide the capacitances are then saved, step 600. In other embodiments, the capacitances that are identified may be those with other characteristics than simply the smallest delay variability factor.

Subsequently, FSM 400 outputs the digital codes to switches 370 and 390 such that the capacitances determined above are coupled to signal lines 280 and 285, step 610. Accordingly, receiver circuit 270 is configured for normal operation, with reduced inherent bias, step 620.

FIGS. 4A–E illustrate the process according to an embodiment of the present invention.

FIG. 4A illustrates a representation 700 of input signals 710 and 720 input into receiver circuit 270 versus time. In this embodiment, input signals 700 and 710 represent the pre-defined series of inputs signals referred to in step 510 above.

FIG. 4B illustrates a representation 730 (data eye) of output signals 740 and 750 from receiver circuit 270 versus time. Output signals 740 and 750 are determined by receiver circuit 270 in response to input signals 710 and 720. In this embodiment, representation 730 represents an ideal or nominal behavior for a receiver circuit without a bias for a low-to-high or high-to-low transition. The slopes of the rise and fall of input signals are directly related to the characteristics of output drivers within receiver circuit 270 coupled to signal lines 280 and 285 and the capacitances coupled thereto.

Also illustrated in FIG. 4B are minimum differential threshold values 760 and 770. In the present embodiment, these threshold values 760 and 770 are the minimum differential threshold required for latch 350 to sense a transition. For example, at locations 780 and 795, output signal 740 is below threshold value 770 and output signal 750 just reaches threshold value 760. Accordingly, locations 780 and 295 would be the earliest points in which latch 350 would sense these transitions. As another example, at location 790, output signal 740 just exceeds threshold value 770 and output signal 750 is below threshold value 770. Accordingly, location 790 would be the earliest point in which latch 350 would sense this transition.

In the embodiment illustrated in FIG. 4B, first transition delay times 800 and 815 and a second transition delay time 810 is shown. In this case, first transition delay times 800 and 815 represent an amount of delay between a first transition 715 and location 780, and a first input transition 701 and location 795, respectively. Further, second transition delay time 810 represents an amount of delay between a second transition 725 until location 790. In an ideal or nominal case, first transition delay time 800 or 815, and second transition delay time 810 are the same or very close. Accordingly, the variability in the delay times (difference between first transition delay time 800 or 815 and second transition delay time 810) is considered zero or very small. Further it is desired that first transition delay time 800 or 815 and second transition delay time be small.

In the present embodiment, to attempt to determine locations such as location 780 or 795 where there are first transitions, or location 790 where there is a second transition, latch 350 is used to "sample" output signals 740 and 750. As discussed above, latch 350 is driven by a rising edge of a generated clock.

Figure 4D:
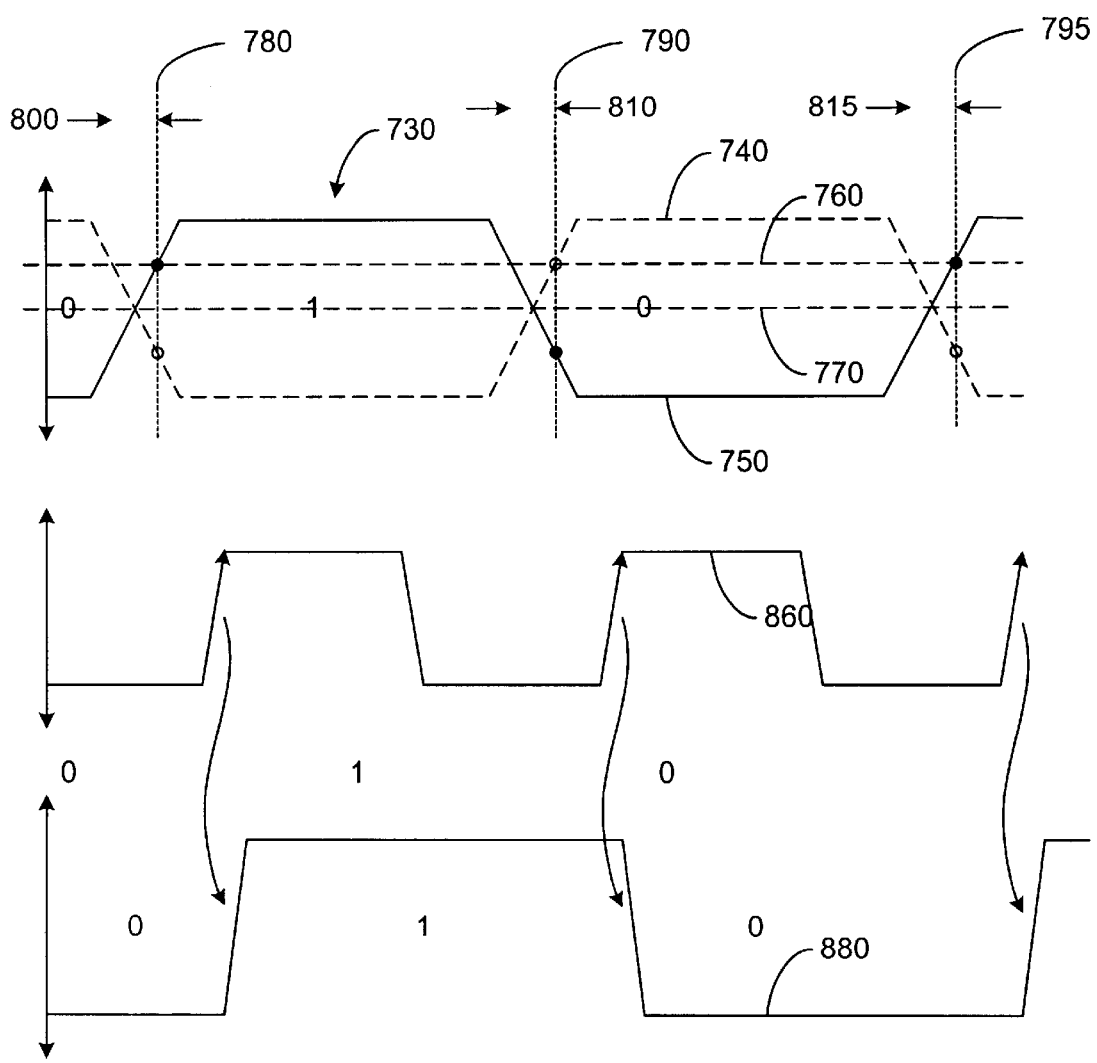
Figure 4E:
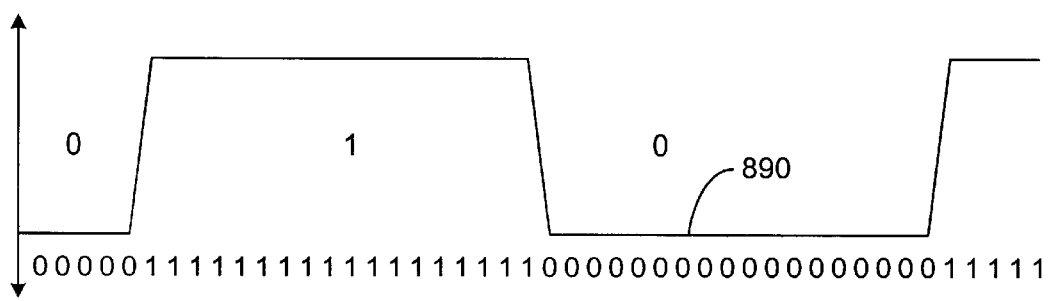

FIGS. 4C and D illustrate examples of clocks provided by DLL 430 at different times to latch 350. As can be seen in this example, clock 850 and clock 860 have different phases. In response to clock 850, the output 870 of latch 350 is shown in FIG. 4C. Further, in response to clock 860, the output 880 of latch 350 is shown in FIG. 4D.

As discussed above, DLL 430 may provide a multitude of clocks, each having different phases to latch 350. This is known as "sweeping" the clock. A result of sweeping a clock through the different phases is that the latch samples output signals 740 and 750 at discrete locations. FIG. 3E illustrates a hypothetical composite output 890 of latch 350 after sampling output signals 740 and 750 at eighteen different phases. The sensed values are also written below output 890 as 1s and 0s.

Figure 5A:
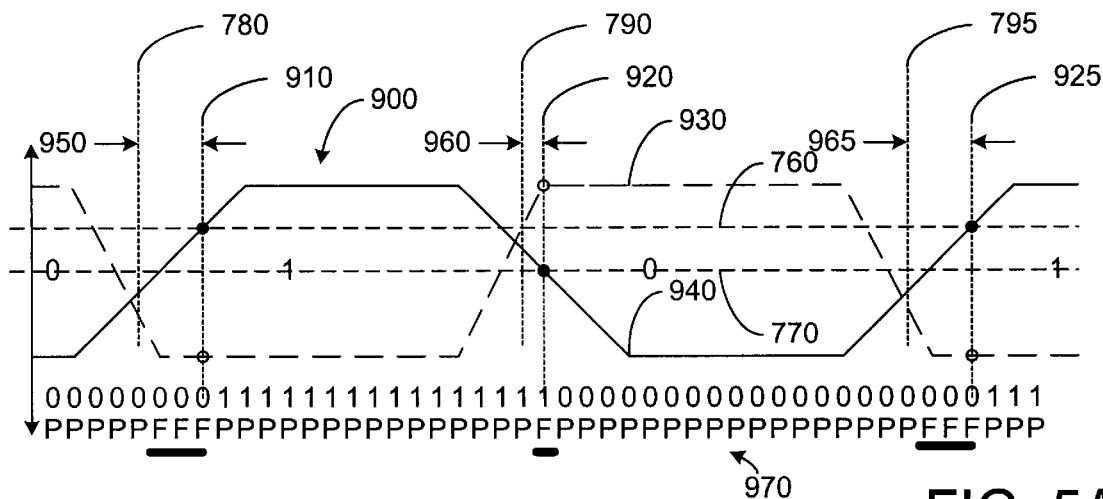
FIGS. 5A–C illustrate an example according to an embodiment of the present invention.
Figure 5B:
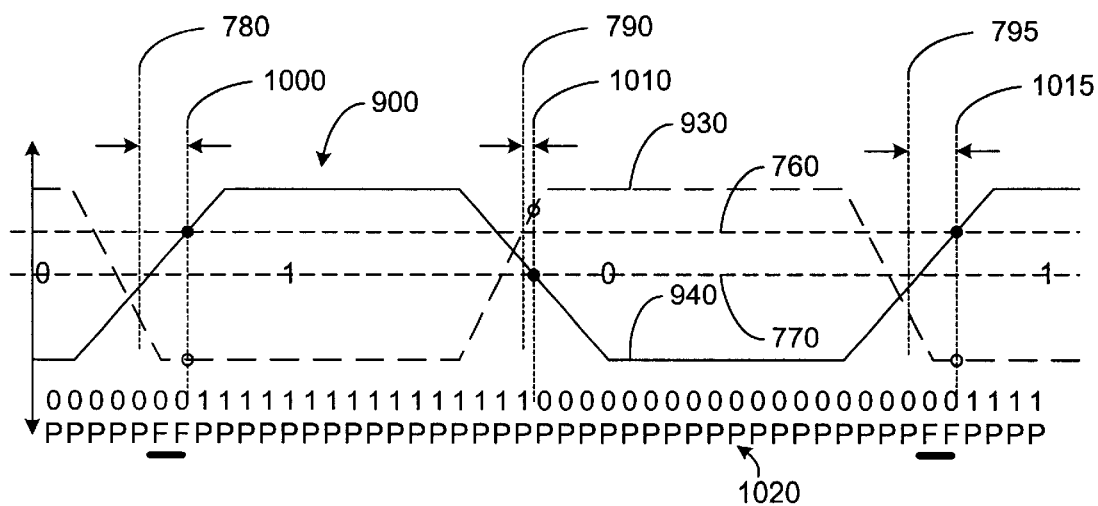
Figure 5C:
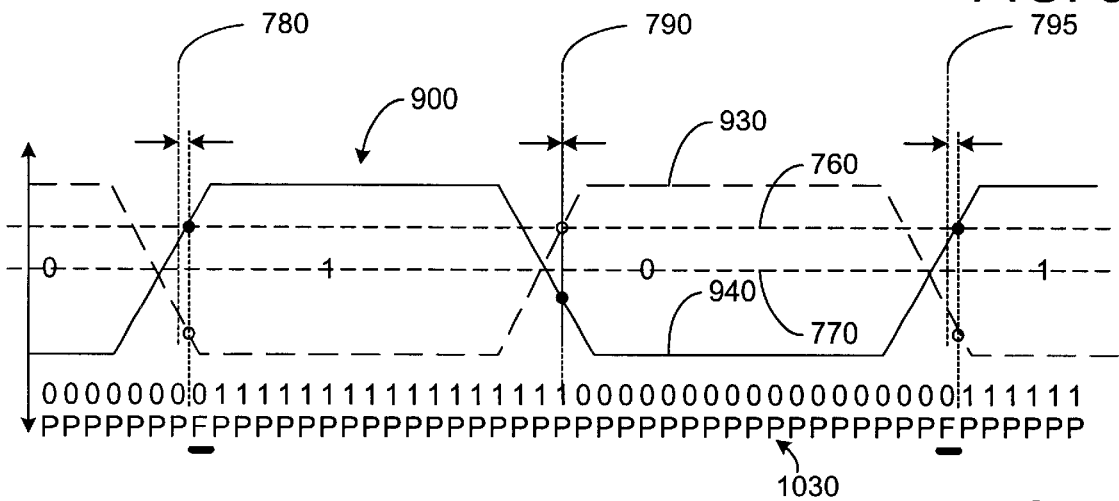

FIGS. 5A–C illustrate an example according to an embodiment of the present invention. In particular, FIGS. 5A–C illustrate the results of sweeping the clock for receiver circuit 270 where the values of capacitors attached to the outputs are varied.

In this example, FIG. 5A illustrates a case where receiver circuit 270 includes an output bias. In the present example, the representation 900 includes locations 910, 920, and 925. In this example, a capacitance coupled to one of the outputs of receiver circuit 270 is too high. This is reflected in output signal 940, by the slope of a low-to-high transition being lower than in FIG. 4B. As was discussed above, by having a larger capacitance coupled to an output, the time constant will increase, resulting in a slower charge-up time , as illustrated. The large capacitance similarly results in a slower decay time for the high-to-low transition.

As a result of the slower transition times, when the clock is swept across representation 900, latch 350 will sense different transition times. In this example, locations 910 and 925 illustrate the earliest times where output signal 940 just exceeds threshold value 760 and output signal 930 is below threshold value 770. Further, location 920 illustrates the earliest time where output signal 940 is just below threshold value 770 and output signal 930 is above threshold value 760.

In FIG. 5A, delay time 950 and 965 are illustrated between location 780 and location 910, and location 795 and location 925, respectively. A delay time 960 is also illustrated between location 725 and location 920. As can be seen in this example, delay times 950 and 965 are different from delay time 960. The difference between the delay times, defined as the delay variability factor or time, should be reduced in the idea case, as was illustrated in FIG. 4B, above. Representing the data in the form of a data eye, representation 900 would appear as a skewed eye that is partially closed.

In the present embodiment, a short-hand method for illustrating the first and second transition delays is represented by a series of "P" (pass) or "F" (fail) (970) indicated below the respective representation. In the example in FIG. 5A, if the results match a nominal or ideal data eye case (FIG. 4B) matches, a P is used, otherwise a F is used. In the present example, as can be seen a number of Fs appear that highlight the differences in the delay times. In the present embodiment, the P/F data construct or "map" is then used by FSM 400 to determine the "success" of different capacitor combinations.

In the example of FIG. 5B, some capacitance was removed from an output of receiver circuit 270. Accordingly, the slope of output signal 940 is increased. In this embodiment, location 1000 illustrates the earliest time where output signal 940 just exceeds threshold value 760 and output signal 930 is below threshold value 770. Further, location 1010 illustrates the earliest time where output signal 940 is just below threshold value 770 and output signal 930 is above threshold value 760. In this embodiment, as illustrated by the P/F map (1020), the capacitance used results in output of receiver circuit 270 that are closer than the nominal case, i.e. there are fewer "Fs."

The example of FIG. 5C illustrates another example where a different capacitance (lower) is used. Using this capacitance, the P/F map (1030) illustrates that the output is closer to the nominal case in FIG. 4B.

From the among only the above three configurations, the configuration in FIG. 5C would be the preferred one, because the delay variability factor is also small, i.e. the difference in number of Fs is small. In addition the absolute number of Fs is small, i.e. the behavior of receiver circuit 270 is close to the nominal or ideal case. In this embodiment, the digital code associated with the capacitance in FIG. 5C is saved by FSM 400. In one embodiment, the digital code is stored in a ROM, or other memory. Later, receiver circuit 270 is operated using the stored capacitance for receiver circuit 270.

The above process may be repeated for each receiver circuit 270 within the circuit, accordingly, for each receiver circuit 270 capacitances may be determined. The capacitances may be different for each receiver circuit 270, or may be similar, if not identical. During operation, it is contemplated that the stored capacitances for each receiver circuit 270 is retrieved and coupled to the respective receiver circuit 270.

In the present embodiment, capacitances of individual capacitors may be in the range from about 100–500 femtofarads, and in other embodiments, capacitances may be in the range from about 100–200 femtofarads. In other embodiments, larger or smaller ranges of capacitances can be used. Based upon experimental data, a typical range for total capacitance on signal line 280, for example, ranges from about 500–1000 femtofarads, and in other embodiments, total capacitance ranges from about 200–800 femtofarads.

In view of the above disclosure, many other variations can be envisioned. For example, instead of comparing the different examples to a nominal or idea output data eye, the different configurations are compared to the input data representation. In such a case, it is still desired to "balance" the number of Fs. It is contemplated that the first series of Fs would be the first transition delay time, and the second series of Fs would be the second transition delay time. If the number of Fs are balanced, the delay variability factor or time is reduced advantageously. Additionally, by reducing the total number of Fs, a more ideal data eye can be obtained.

In another embodiment, instead of testing all combinations of capacitors and determining a desired combination, combinations are tested as necessary. Further, sweeping of the clock, as described above, may not be performed. For example, in one embodiment, the P/F "map" described above may be determined for a certain capacitance. Next, DLL 430 places the rising edge of the clock at location where a transition is expected, but not found, i.e. an F. After this, different combinations of capacitors are coupled to the outputs of receiver circuit 270. For each combination, DLL 430 provides a clock at the expected transition point. When a combination of capacitors results in an output where DLL 430 senses the transition, that combination of capacitor is saved for "regular" operation of receiver circuit 270.

In other embodiments of the present invention, combinations or sub-combinations of the above-disclosed invention can be advantageously made. The block diagrams of the architecture and flowcharts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method for reducing delay variability in a differential receiver comprises:
   receiving a plurality of differential input signals;
   determining a first transition delay time of an output in response to the plurality of differential input signals, the first transition delay time associated with a rising signal bias of the differential receiver;
   determining a second transition delay time of the output in response to the plurality of differential input signals, the second transition delay time associated with a falling signal bias of the differential receiver; and
   modifying capacitance coupled to the output in response to the first transition delay time and to the second transition delay time.

2. The method of claim 1 wherein modifying the capacitance comprises modifying capacitance coupled to the output to reduce any delay time difference between the first transition delay time and the second transition delay time.

3. The method of claim 1
   wherein the plurality of differential input signals comprises a first input signal and a second input signal;
   wherein the differential output signals comprises a first output signal and a second output signal; and
   wherein the output is selected from the group: the first output signal and the second output signal.

4. The method of claim 3 wherein determining the first transition delay time comprises:
   determining a first transition time for the output when a voltage of the first output signal exceeds an upper differential voltage; and
   determining the first transition delay time in response to the first transition time and to a nominal first transition time.

5. The method of claim 4 wherein determining the second transition delay time comprises:
   determining a second transition time for the output when a voltage of the output signal is less than a lower differential voltage; and
   determining the second transition delay time in response to the second transition time and to a nominal second transition time.

6. The method of claim 1 wherein modifying the capacitance comprises adding capacitance to the output.

7. The method of claim 4 wherein determining the first transition time further comprises adjusting a rising edge of a clock until the first output signal does not exceed the upper differential voltage.

8. A method for configuring a differential amplifier comprises:
   varying an amount of capacitance coupled to the differential amplifier;
   for each amount of capacitance coupled to the differential amplifier, determining an associated delay variability factor of the differential amplifier, wherein the associated delay variability factor is associated with a bias selected from a group comprising: rising transition bias, falling transition bias;
   determining a target amount of capacitance, the target amount of capacitance having an associated delay variability factor lower than other associated delay variability factors; and
   coupling the target amount of capacitance to the differential amplifier.

9. The method of claim 8 further comprising operating the differential amplifier with the target amount of capacitance coupled thereto.

10. The method of claim 8 wherein varying the amount of capacitance comprises:
    coupling a first capacitance amount to the differential amplifier; and
    thereafter coupling a second capacitance to the differential amplifier.

11. The method of claim 10 wherein determining the target amount of capacitance comprises:
    determining a first delay variability factor for the differential amplifier when coupled to the first capacitance amount;
    determining a second delay variability factor for the differential amplifier when coupled to the second capacitance amount; and
    using the first capacitance amount as the target amount of capacitance when the first delay variability factor is less than the second delay variability factor.

12. The method of claim 11 wherein determining the first delay variability factor comprises:
    determining a first transition delay for differential outputs of the differential amplifier;
    determining a second transition delay for the differential outputs of the differential amplifier; and
    determining a difference between the first transition delay and the second transition delay.

13. The method of claim 12 wherein determining a first transition delay comprises:
    determining a first transition for the differential outputs of the differential amplifier; and
    comparing the first transition with a nominal transition for the differential outputs.

14. The method of claim 8 wherein determining the associated delay variability factor of the differential amplifier comprises:
    applying an input test signal.

15. An apparatus for amplifying differential signals comprises:
    a differential amplifier having differential outputs;
    a series of controllable switches coupled to the differential outputs of the differential amplifier;

a series of capacitors coupled to the series of controllable switches; and state machine coupled to the differential outputs and to the series of controllable switches, the state machine configured to vary an amount of capacitance coupled to the differential outputs by controlling the controllable switches, wherein the state machine is also configured to determine an associated delay variability factor of the differential amplifier for each capacitance coupled to the differential outputs, and wherein the state machine is configured to determine a target amount of capacitance, the target amount of capacitance having an associated delay variability factor lower than other associated delay variability factors.

16. The apparatus of claim 15 further comprising coupling the target amount of capacitance to the differential outputs during normal operation of the apparatus.

17. The apparatus of claim 15 wherein the state machine is configured to couple a first capacitance amount to the differential outputs and thereafter to couple a second capacitance to the differential outputs.

18. The apparatus of claim 17 wherein the state machine is also configured to determine a first delay variability factor for the differential amplifier when coupled to the first capacitance amount, to determine a second delay variability factor for the differential amplifier when coupled to the second capacitance amount, and wherein the first capacitance amount as the target amount of capacitance when the first delay variability factor is less than the second delay variability factor.

19. The apparatus of claim 18 wherein the state machine is also configured to determining a first transition delay for differential outputs of the differential amplifier, configured to determine a second transition delay for the differential outputs of the differential amplifier; and configured to determine a difference between the first transition delay and the second transition delay.

20. The apparatus of claim 19 wherein the state machine is also configured to determine a first transition for the differential outputs of the differential amplifier, and configured to compare the first transition with a nominal transition for the differential outputs.

* * * * *